United States Patent
Fujii (10) Patent No.: US 10,801,786 B2
(45) Date of Patent: Oct. 13, 2020

(54) GAS-LIQUID SEPARATION DEVICE, REAR DOOR, COOLING DEVICE, AND GAS-LIQUID SEPARATING METHOD

(71) Applicant: NEC Corporation, Minato-ku, Tokyo (JP)

(72) Inventor: Shunsuke Fujii, Tokyo (JP)

(73) Assignee: NEC CORPORATION, Tokyo (JP)

( * ) Notice: Subject to any disclaimer, the term of this patent is extended or adjusted under 35 U.S.C. 154(b) by 99 days.

(21) Appl. No.: 16/148,230

(22) Filed: Oct. 1, 2018

(65) Prior Publication Data

US 2019/0101335 A1 Apr. 4, 2019

(30) Foreign Application Priority Data

Oct. 4, 2017 (JP) .................. 2017-194124

(51) Int. Cl.
  *F25B 43/00* (2006.01)
  *F28D 15/02* (2006.01)
  (Continued)

(52) U.S. Cl.
  CPC ............. *F28D 15/02* (2013.01); *F16T 1/20* (2013.01); *F16T 1/45* (2013.01); *F28D 15/0266* (2013.01);
  (Continued)

(58) Field of Classification Search
  CPC .. F28D 15/02; F28D 15/0266; F28D 15/0275; H05K 7/20818; F16T 1/20; F16T 1/45
  (Continued)

(56) References Cited

U.S. PATENT DOCUMENTS

| | | | | |
|---|---|---|---|---|
| 2,841,962 A | * | 7/1958 | Richards | F25B 1/10 62/174 |
| 6,240,738 B1 | * | 6/2001 | Kato | B60H 1/3225 62/239 |

(Continued)

FOREIGN PATENT DOCUMENTS

| | | |
|---|---|---|
| CN | 101814469 A | 8/2010 |
| EP | 3073813 A1 | 9/2016 |

(Continued)

OTHER PUBLICATIONS

Singaporean Office Action for SG Application No. 10201808662V dated Oct. 22, 2019.

(Continued)

*Primary Examiner* — Davis D Hwu (57) ABSTRACT

The present invention provides a gas-liquid separation device, a rear door, a cooling device, and a gas-liquid separating method capable of reducing the tank capacity. The gas-liquid separation device includes a tank (13) which is provided in a heat receiving section configured to recover exhaust heat from a cooling object, and has a refrigerant vapor inflow section (13a) into which a refrigerant vapor flowing out from the heat receiving section via a vapor pipe (2) is introduced, and a refrigerant gas outflow section (13b) from which the refrigerant gas of the refrigerant vapor is discharged, the tank being capable of storing refrigerant liquid of the refrigerant vapor on a lower surface; and a regulating valve (12) which floats on the refrigerant liquid stored in the tank (13) and closes a space between the vapor pipe (2) and the tank (13).

7 Claims, 7 Drawing Sheets

(51) Int. Cl.
  *F16T 1/45* (2006.01)
  *F16T 1/20* (2006.01)
  *H05K 7/20* (2006.01)

(52) U.S. Cl.
  CPC ..... *F28D 15/0275* (2013.01); *H05K 7/20818* (2013.01)

(58) Field of Classification Search
  USPC .......................................................... 62/512
  See application file for complete search history.

(56) References Cited

U.S. PATENT DOCUMENTS

| | | |
|---|---|---|
| 2017/0303432 A1 | 10/2017 | Matsunaga et al. |
| 2018/0313612 A1 | 11/2018 | Nakamura et al. |

FOREIGN PATENT DOCUMENTS

| | | |
|---|---|---|
| JP | S52-23751 U1 | 2/1977 |
| JP | H06-109345 A | 4/1994 |
| JP | 2015-014413 A | 1/2015 |
| JP | 6170110 B2 | 7/2017 |
| JP | 2017-138060 A | 8/2017 |
| KR | 10-2013-0104044 A | 9/2013 |
| WO | 2016/047098 A1 | 3/2016 |
| WO | 2016/159056 A1 | 10/2016 |
| WO | 2017/064872 A1 | 4/2017 |

OTHER PUBLICATIONS

Japanese Office Action for JP Application No. 2017-194124 dated Jul. 17, 2018 with English Translation.

\* cited by examiner

GAS-LIQUID SEPARATION DEVICE, REAR DOOR, COOLING DEVICE, AND GAS-LIQUID SEPARATING METHOD

INCORPORATION BY REFERENCE

This application is based upon and claims the benefit of priority from Japanese patent application No. 2017-194124, filed Oct. 4, 2017, the disclosure of which is incorporated herein in its entirety by reference.

TECHNICAL FIELD

The present invention relates to a gas-liquid separation device, a rear door, a cooling device, and a gas-liquid separating method.

BACKGROUND ART

Due to the progress of the information society in recent years, a volume of information is expected to increase drastically. Because of this increase in information, it will be necessary to install a large number of electronic devices such as servers with a high information processing ability.

In particular, in a data center in which a large number of electronic devices are densely packed, a lot of heat is discharged. In order to maintain the processing ability of the electronic devices, a cooling device that discharges heat via a phase change cycle such as evaporation and condensation of a refrigerant may be provided.

For example, PCT International Publication No. WO 2016/159056 discloses a cooling device using the phase change cycle of evaporation and condensation of the refrigerant that receives heat from an electronic device using a multipart heat-receiving section, such that heat can be discharged from an electronic device.

SUMMARY

The refrigerant vapor obtained by vaporizing the refrigerant in the heat receiving section is a gas-liquid mixture two-phase flow in which liquid and gas are mixed. In the cooling device of PCT International Publication No. WO 2016/159056, a tank is provided above the multistage heat receiving section so that the liquid of the gas-liquid mixed two-phase flow does not hinder the flow of the gas, and the refrigerant vapor in the vapor pipe is separated into refrigerant gas and refrigerant liquid.

However, when the refrigerant liquid accumulates in the tank, the refrigerant liquid may overflow into the vapor pipe. When the refrigerant liquid overflows into the vapor pipe, it hinders the flow of the refrigerant vapor and the heat transport efficiency drops. Therefore, in the cooling device of PCT International Publication No. WO 2016/159056, it is necessary to increase the tank capacity so that the refrigerant liquid does not overflow.

The present invention provides a gas-liquid separation device, a rear door, a cooling device, and a gas-liquid separating method in which a tank capacity is able to be reduced.

A gas-liquid separation device of a first aspect includes a tank which is provided in a heat receiving section configured to recover exhaust heat from a cooling object, and has a refrigerant vapor inflow section into which a refrigerant vapor flowing out from the heat receiving section via a vapor pipe is introduced, and a refrigerant gas outflow section from which the refrigerant gas of the refrigerant vapor is discharged, the tank being capable of storing refrigerant liquid of the refrigerant vapor on a lower surface; and a regulating valve which floats on the refrigerant liquid stored in the tank and closes a space between the vapor pipe and the tank.

A gas-liquid separating method of a second aspect includes a step of providing a regulating valve capable of floating on a refrigerant liquid inside a tank which is provided in a heat receiving section configured to recover exhaust heat from a cooling object, and has a refrigerant vapor inflow section into which a refrigerant vapor flowing out from the heat receiving section via a vapor pipe is introduced, and a refrigerant gas outflow section from which the refrigerant gas of the refrigerant vapor is discharged, the tank being capable of storing the refrigerant liquid of the refrigerant vapor on a lower surface; a step of storing the refrigerant liquid on the lower surface in the tank to make the regulating valve float; and a step of closing a space between the vapor pipe and the tank.

EXAMPLE EMBODIMENT

A cooling device according to an embodiment of the present invention will be described below with reference to the drawings.

<Embodiment>

An embodiment of the cooling device will be described below with reference to FIGS. 1 to 7.

Figure 1:
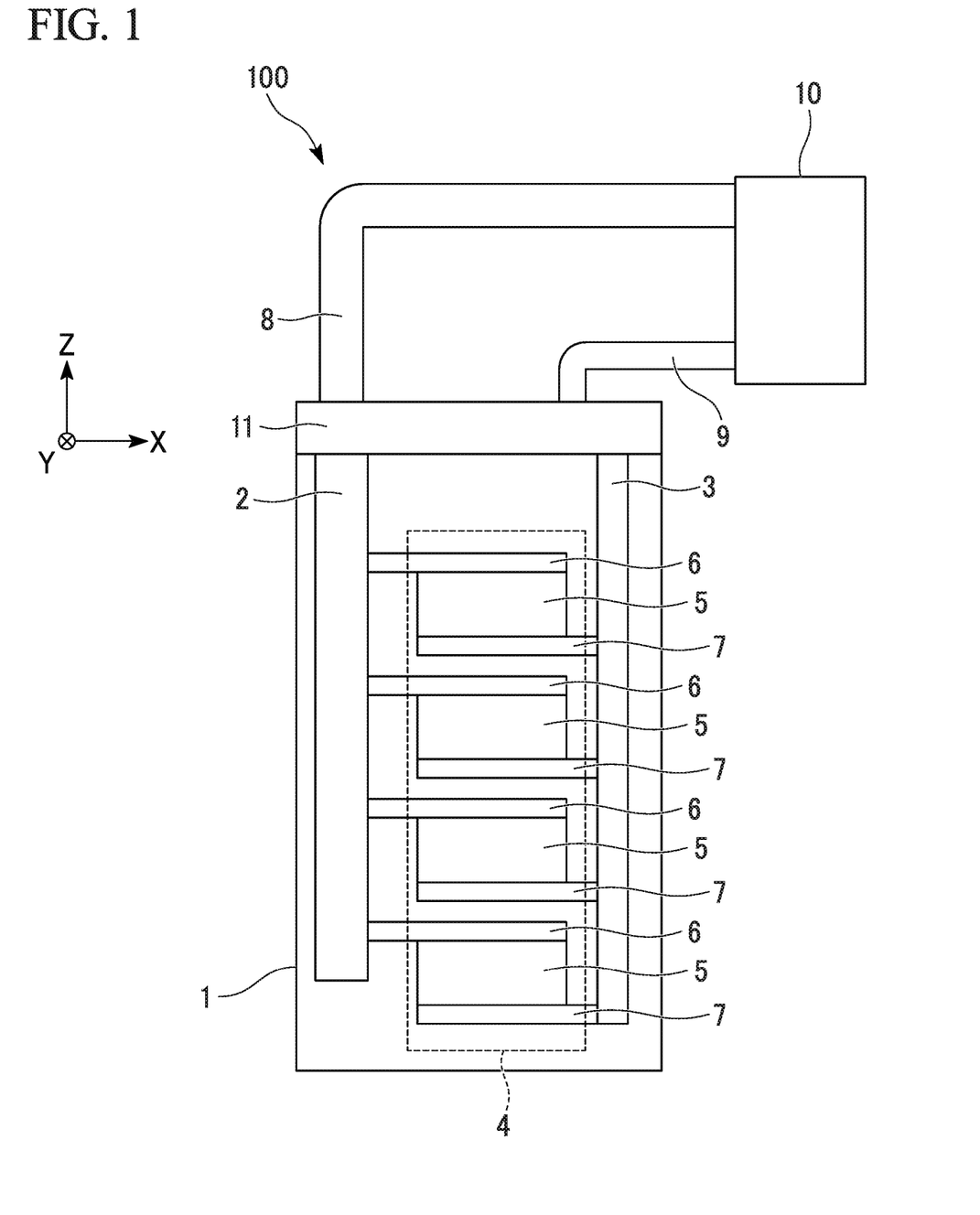
FIG. 1 is a schematic view of a cooling device according to an embodiment of the present invention.

FIG. 1 is a schematic diagram of a cooling device 11 according to the embodiment. As shown in FIG. 1, the cooling device 100 includes a rear door 1, a first pipe 8, a second pipe 9, and a heat exchanger 10. The cooling device 100 constitutes a heat transportation system for performing heat transportation between the heat exchanger 10 and the rear door 1 via the first pipe 8 and the second pipe 9.

Hereinafter, an upward direction is described as a +Z direction, and the horizontal surface is described as an XY plane.

The heat exchanger 10 condenses (cools) a refrigerant gas CG in a refrigerant vapor CV discharged from the rear door 1 by heat exchange to form a refrigerant liquid CL.

The first pipe 8 connects the gas-liquid separation device 11 and the heat exchanger 10 so that the refrigerant gas CG can be sent from the gas-liquid separation device 11 to the heat exchanger 10.

The second pipe 9 connects the heat exchanger 10 and the gas-liquid separation device 11 so that the refrigerant liquid CL can be sent from the heat exchanger 10 to the gas-liquid separation device 11.

The rear door 1 includes a vapor pipe 2, a liquid pipe 3, a plurality of heat receiving sections 5, a plurality of vapor pipe branches 6, a plurality of liquid pipe branches 7, and a gas-liquid separation device 11. The rear door 1 has an opening portion 4 in order to apply exhaust heat of an electronic device such as a server to the heat receiving section 5.

The rear door 1 is provided so as to be openable and closable on the back of a rack in which an electronic device such as a server is accommodated, and maintenance is performed by opening and closing of the rear door 1.

The vapor pipe 2 is connected to each vapor pipe branch 6 from one end and the other end of the vapor pipe 2. The vapor pipe 2 is connected to the gas-liquid separation device 11 at one end.

The liquid pipe 3 is connected to each liquid pipe branch 7 from one end to the other end of the liquid pipe 3. The liquid pipe 3 is connected to the gas-liquid separation device 11 at one end.

Each heat receiving section 5 is connected to one corresponding vapor pipe branch 6 at the upper end.

Each heat receiving section 5 is connected to each corresponding liquid pipe branch 7 at the lower end.

One end of the first pipe 8 is connected to the gas-liquid separation device 11, and the other end of the first pipe 8 is connected to the heat exchanger 10.

One end of the second pipe 9 is connected to the gas-liquid separation device 11, and the other end of the second pipe 9 is connected to the heat exchanger 10.

With these configurations, the cooling device 100 is filled with a predetermined amount of refrigerant and constitutes a circulation circuit of the refrigerant.

The refrigerant liquid CL is introduced to each heat receiving section 5 from each corresponding liquid pipe branch 7. Each heat receiving section 5 receives exhaust heat from the server, and the refrigerant liquid CL therein boils and vaporizes. Therefore, each heat receiving section 5 recovers the exhaust heat of the server. The vaporized refrigerant liquid CL is discharged as a refrigerant vapor CV from each corresponding vapor pipe branch 6.

Figure 2:
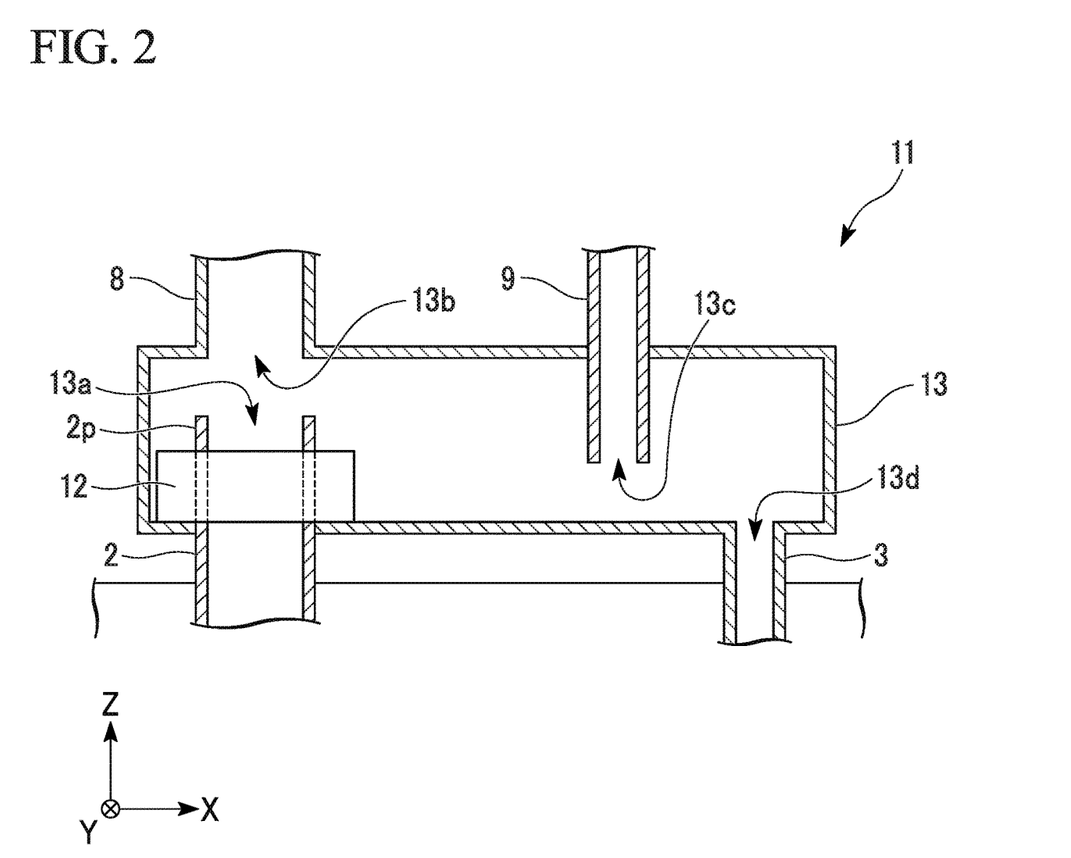
FIG. 2 is a cross-sectional view of a main part of a gas-liquid separation device according to the embodiment of the present invention.

The details of the gas-liquid separation device 11 of the present embodiment will be described with reference to FIG. 2. FIG. 2 is a cross-sectional view of a main part of the gas-liquid separation device 11 according to the embodiment.

Figure 3:
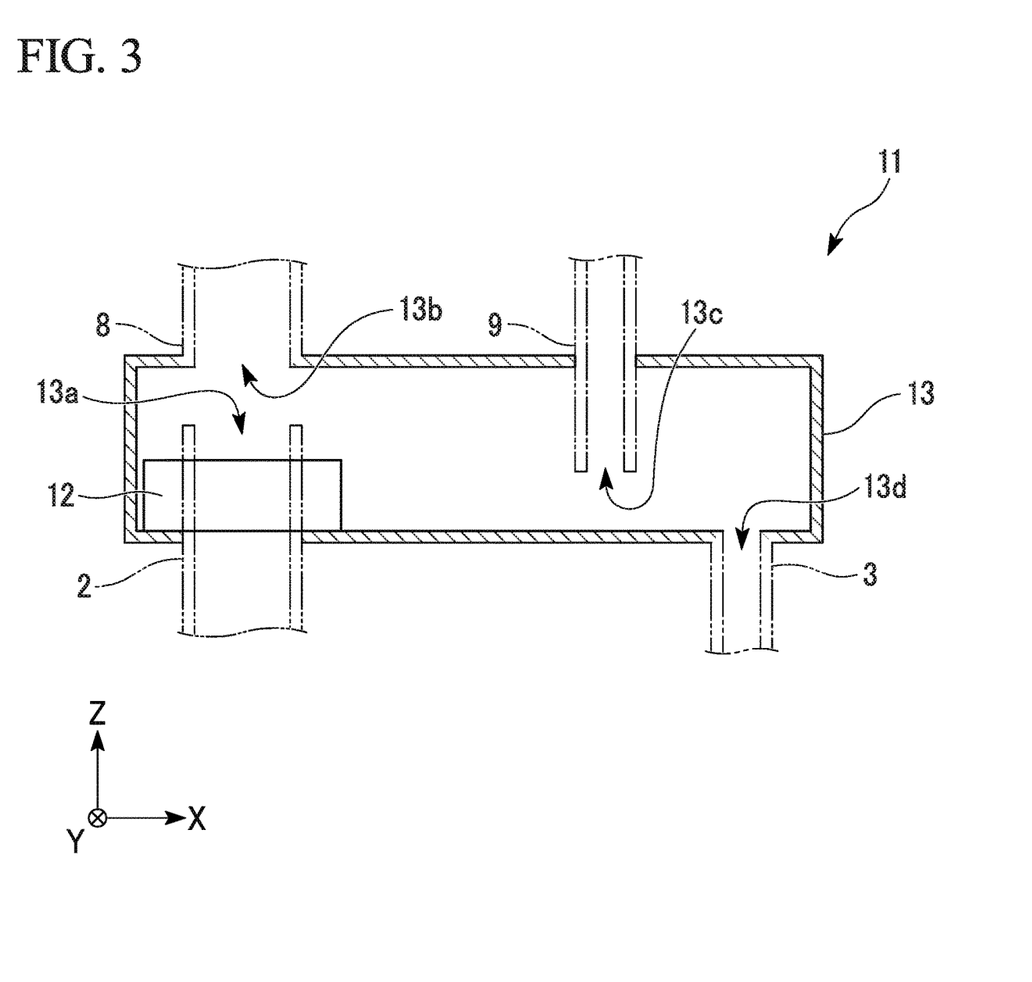
FIG. 3 is a cross-sectional view of a main part showing a minimum configuration of the gas-liquid separation device according to the embodiment of the present invention.

FIG. 3 is a cross-sectional view of a main part showing the minimum configuration of the gas-liquid separation device 11 according to the embodiment. FIG. 3 shows the gas-liquid separation device 11 including a regulating valve 12 and a tank 13 as a minimum configuration of the present embodiment.

(Tank)

The refrigerant vapor CV discharged from each heat receiving section 5 via each vapor pipe branch 6 and the vapor pipe 2 is introduced into the tank 13. At this time, the refrigerant vapor CV is a gas-liquid mixed two-phase flow in which the refrigerant liquid CL and the refrigerant gas CG are mixed.

The tank 13 has a container structure capable of storing the refrigerant liquid CL of the refrigerant vapor CV on the bottom surface.

The tank 13 has a refrigerant vapor inflow section 13a into which the refrigerant vapor CV flowing out from each heat receiving section 5 via the respective vapor pipe branches 6 and the vapor pipe 2 is introduced, and a refrigerant gas outflow section 13b through which the refrigerant gas CG of the refrigerant gas CV in the tank 13 is discharged. The tank 13 further has a refrigerant liquid inflow section 13c into which the refrigerant liquid CL flowing in from the heat exchanger 10 via the second pipe 9 is introduced, and a refrigerant liquid outflow section 13d from which the refrigerant liquid CL in the tank 13 is discharged.

The vapor pipe 2 penetrates the lower surface of the tank 13 and protrudes into the tank 13 upward from the lower surface of the tank 13.

In the present embodiment, since the vapor pipe 2 protrudes into the tank 13 and is open, the refrigerant vapor inflow section 13a is formed in the tank 13.

Therefore, the inside of the pipe of the vapor pipe 2 communicates with the inside of the tank 13.

The first pipe 8 is connected to the upper surface of the tank 13. In the present embodiment, since the first pipe 8 opens toward the inside of the tank 13, the refrigerant gas outflow section 13b is formed in the tank 13.

Therefore, the inside of the pipe of the first pipe 8 communicates with the inside of the tank 13.

The first pipe 8 faces the vapor pipe 2. In the present embodiment, the first pipe 8 is disposed above the vapor pipe 2 so that a pipe axis of the first pipe 8 coincides with a pipe axis of the vapor pipe 2 in the XY in-plane direction.

The second pipe 9 penetrates the upper surface of the tank 13 and protrudes into the tank 13 downward from the upper surface of the tank 13. In the present embodiment, since the second pipe 9 protrudes into the tank 13 and is open, the refrigerant liquid inflow section 13c is formed in the tank 13.

Therefore, the inside of the pipe of the second pipe 9 communicates with the inside of the tank 13.

The liquid pipe 3 is connected to the lower surface of the tank 13. In the present embodiment, since the liquid pipe 3 opens toward the inside of the tank 13, the refrigerant liquid outflow section 13d is formed in the tank 13.

Therefore, the inside of the pipe of the liquid pipe 3 communicates with the inside of the tank 13.

The second pipe 9 faces the liquid pipe 3. In the present embodiment, the second pipe 9 is disposed above the liquid pipe 3 so that the pipe axis of the second pipe 9 is shifted from the pipe axis of the liquid pipe 3 in the XY in-plane direction.

In the present embodiment, as shown in FIG. 2, the vapor pipe 2 and the liquid pipe 3 are arranged in the X direction, and the first pipe 8 and the second pipe 9 are arranged in the X direction. The pipe axis of the second pipe 9 and the pipe axis of the liquid pipe 3 are shifted from each other in the X direction.

The regulating valve 12 has a ring shape. The regulating valve 12 is inserted through the protruding section 2p of the vapor pipe 2 protruding into the tank 13. The regulating valve 12 is vertically slidable with respect to the outer periphery of the protruding section 2p of the vapor pipe 2.

The regulating valve 12 is a component that floats on the refrigerant liquid CL. That is, the regulating valve 12 is configured so that its buoyancy becomes greater than its own weight when submerged in the refrigerant liquid CL. In order to make the buoyancy greater than its own weight, the regulating valve 12 may be made of a material having a specific gravity lower than the refrigerant liquid CL or may have a structure having pores or an air chamber.

The operation of the cooling device 100 of this embodiment will be described.

First, exhaust heat of the server hits the heat receiving section 5 through the opening portion 4. As a result, the refrigerant liquid CL in the circulation circuit boils and evaporates (absorbs heat) to form the refrigerant vapor CV.

The refrigerant vapor CV evaporated in the heat receiving section 5 is introduced into the gas-liquid separation device 11 via the vapor pipe branch 6 and the vapor pipe 2. Of the refrigerant vapor CV introduced into the gas-liquid separation device 11, the refrigerant gas CG passes through the first pipe 8 and passes through the heat exchanger 10, and the refrigerant gas CG is condensed (cooled) to form a refrigerant liquid CL.

Figure 4:
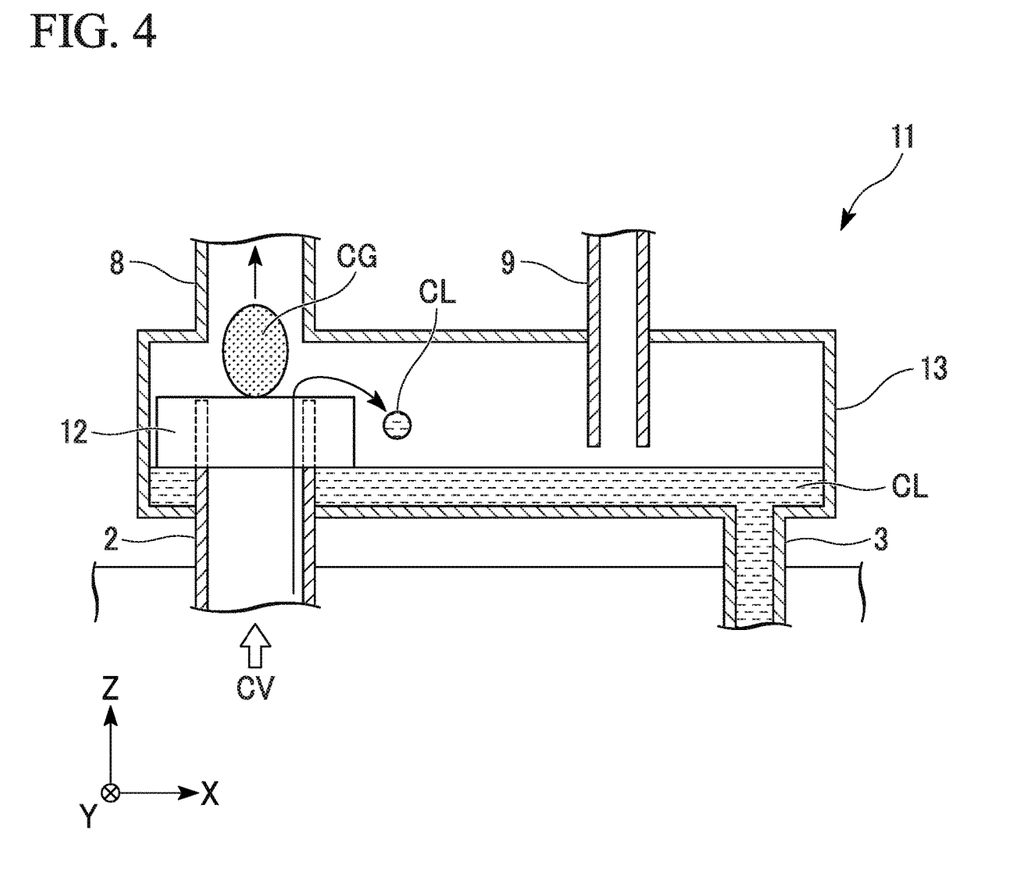
FIG. 4 is a first diagram showing the operation of the gas-liquid separation device according to the embodiment of the present invention.

FIG. 4 is a first diagram showing the operation of the gas-liquid separation device 11 according to the embodiment.

The refrigerant liquid CL of the heat exchanger 10 passes through the inside of the circulation circuit in the order of the second pipe 9, the gas-liquid separation device 11, the liquid pipe 3 and the liquid pipe branch 7 and returns to the heat receiving section 5 again.

At this time, as shown in FIG. 4, in the gas-liquid separation device 11, the refrigerant gas CG of the refrigerant vapor CV flowing into the tank 13 rises immediately and flows to the first pipe 8.

On the other hand, the refrigerant liquid CL of the refrigerant vapor CV flowing into the tank 13 accumulates on the bottom surface of the tank 13. As the circulation progresses, the liquid level of the refrigerant liquid CL accumulated on the bottom surface of the tank 13 rises. When the liquid level rises, the regulating valve 12 floats and rises together with the liquid level.

Figure 5:
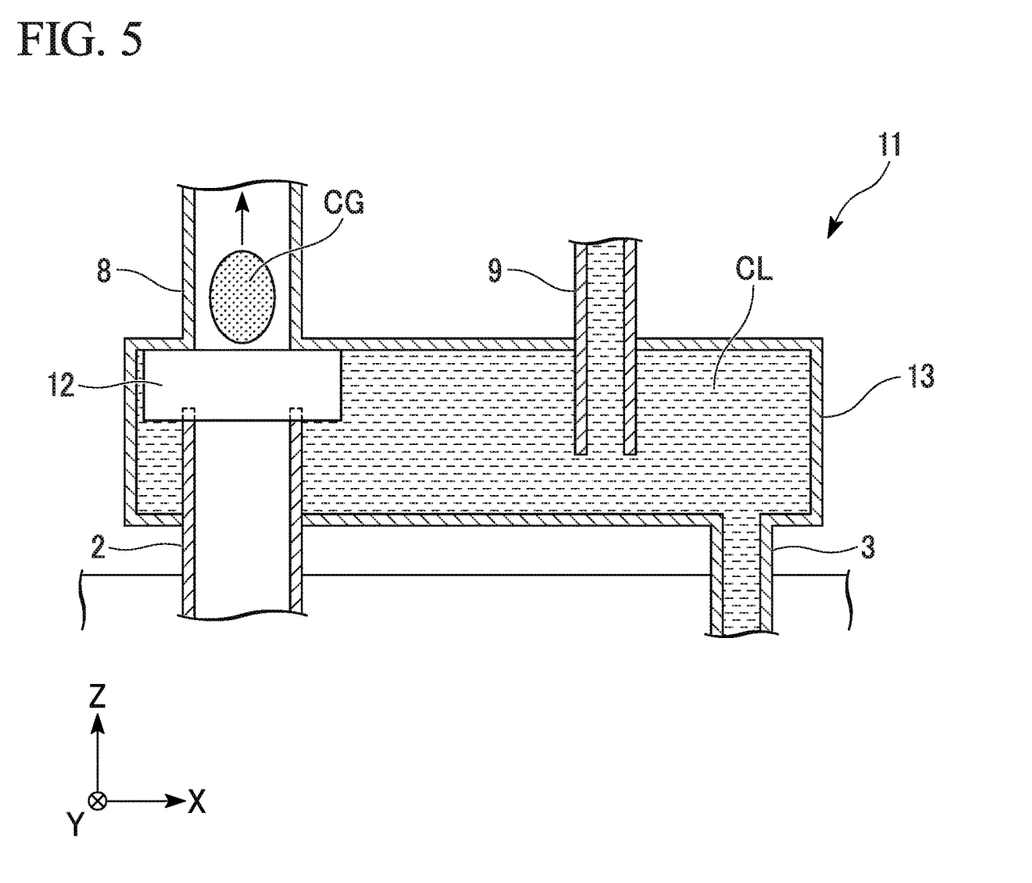
FIG. 5 is a second diagram showing the operation of the gas-liquid separation device according to the embodiment of the present invention.

FIG. 5 is a second diagram showing the operation of the gas-liquid separation device 11 according to the embodiment. As shown in FIG. 5, when the refrigerant liquid CL accumulated in the tank 13 reaches a certain amount, the floating regulating valve 12 closes the space between the tank 13 and the vapor pipe 2, and prevents the refrigerant liquid CL in the tank 13 from flowing backward into the vapor pipe 2.

The operation and effect of the cooling device 100 of this embodiment will be described.

The gas-liquid separation device 11 of the cooling device 100 stores the refrigerant liquid CL on the bottom surface of the tank 13. When the storage amount of the refrigerant liquid CL increases, the liquid level of the stored refrigerant liquid CL rises. Therefore, in a case where the regulating valve 12 is not provided, when the liquid level of the refrigerant liquid CL rises and passes beyond the opening surface of the upper end of the vapor pipe 2 which is the refrigerant vapor inflow section 13a, the refrigerant liquid CL may flow backward toward the vapor pipe 2.

In the present embodiment, the regulating valve 12 is configured to float with respect to the liquid level of the stored refrigerant liquid CL. Therefore, when the refrigerant liquid CL reaches a certain amount, the floated regulating valve 12 closes the space between the tank 13 and the vapor pipe 2 to suppress the overflow of the refrigerant liquid CL, and suppresses the reverse flow of the refrigerant liquid CL from the tank 13 to the vapor pipe 2.

Therefore, since it is possible to secure the gas-liquid separation function even in a small tank, the tank capacity can be reduced in the gas-liquid separation device of this embodiment.

(Modified Example)

In the present embodiment, the regulating valve 12 is vertically slidable with respect to the outer periphery of the protruding section 2p (FIG. 2) of the vapor pipe 2. As a modified example, the regulating valve 12 may have a seal section for sealing the refrigerant liquid CL between the regulating valve 12 and the protruding section 2p. Specifically, an O-ring or a packing may be provided as the seal section. This is provided that the seal section slidably seals such that the regulating valve 12 can move up and down along with rising and lowering of the liquid level.

The gas-liquid separation device 11 can further minimizes backflow of the refrigerant liquid CL into the vapor pipe 2 due to this sealing section sealing the space between the regulating valve 12 and the protruding section 2p.

Figure 6:
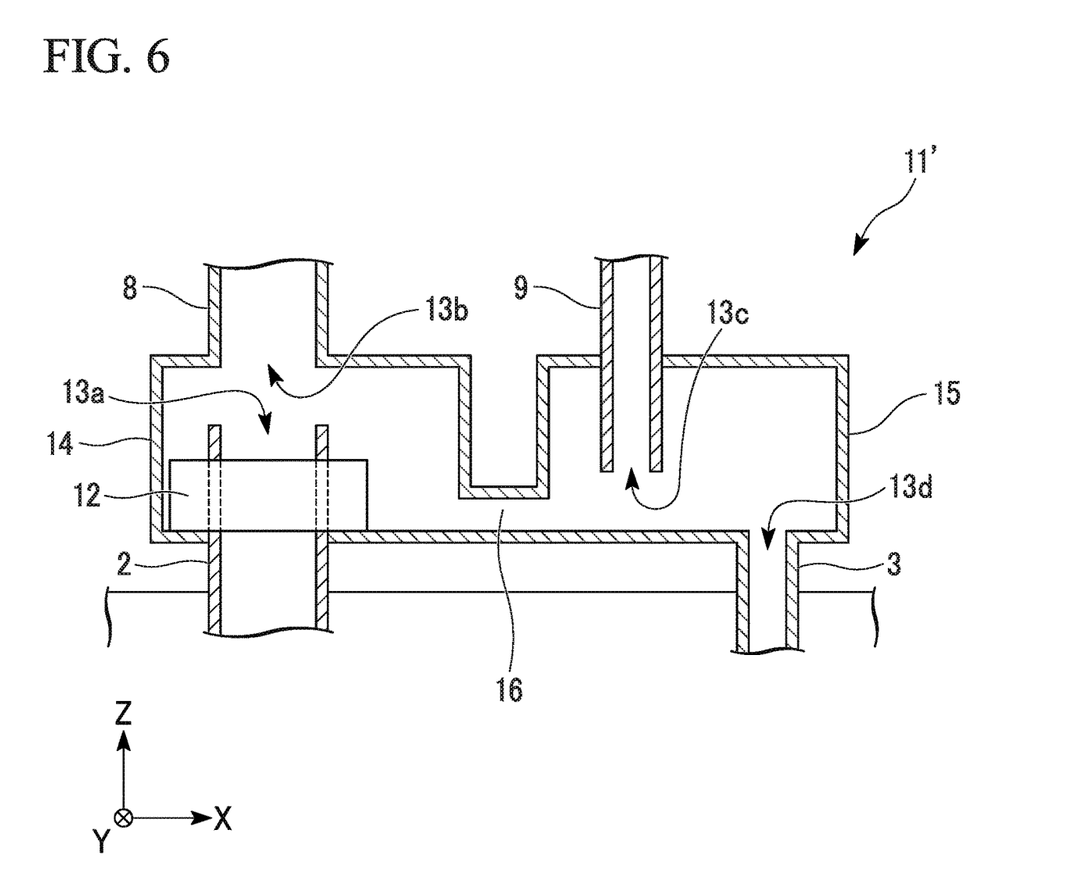
FIG. 6 is a cross-sectional view of a main part of a modified example of the gas-liquid separation device according to the embodiment of the present invention.

FIG. 6 is a cross-sectional view of a main part of a modified example of the gas-liquid separation device 11 according to the embodiment. In the present embodiment, a refrigerant vapor inflow section 13a, a refrigerant gas outflow section 13b, a refrigerant liquid inflow section 13c, and a refrigerant liquid outflow section 13d are provided in one tank 13. As a modified example, as in a gas-liquid separation device 11' shown in FIG. 6, one tank is divided into a first tank 14 having a refrigerant vapor inflow section 13a and a refrigerant gas outflow section 13b, and a second tank 15 having a refrigerant liquid inflow section 13c and a refrigerant liquid outflow section 13d. In this case, a communicating section 16 may be provided between the two tanks so that the refrigerant liquid CL stored in the first tank 14 can be discharged to the second tank 15.

(Gas-Liquid Separating Method)

The gas-liquid separating method will be described with reference to FIG. 7, using the gas-liquid separation device 11 of the present embodiment.

Figure 7:
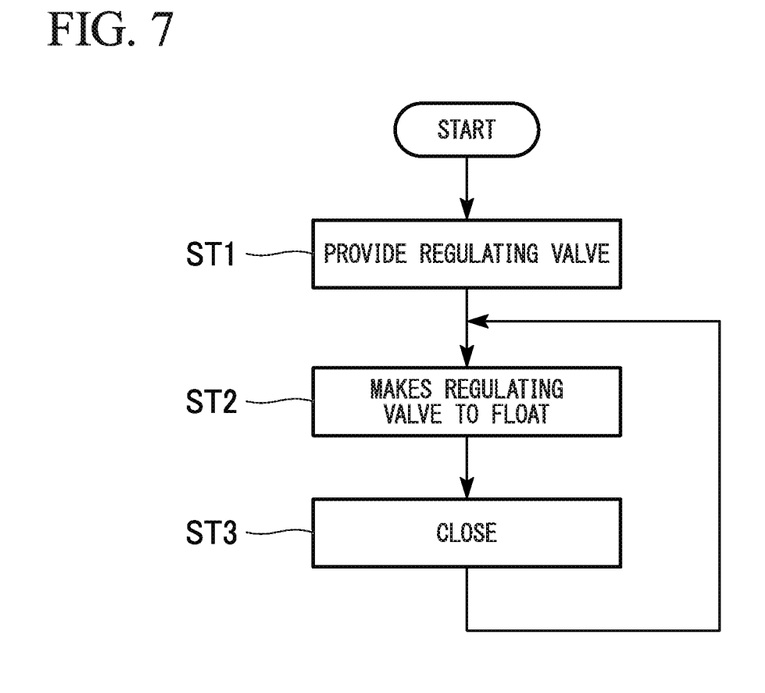
FIG. 7 is a flowchart of a gas-liquid separating method according to the embodiment of the present invention.

FIG. 7 is a flowchart of the gas-liquid separating method according to the embodiment. First, as shown in FIG. 7, a regulating valve 12 capable of floating on the refrigerant liquid CL is provided in the tank 13 capable of storing the refrigerant liquid CL of the refrigerant vapor CV on the lower surface (ST1: a step of providing a regulating valve).

Next, the refrigerant liquid CL is stored on the lower surface of the tank 13, and the regulating valve 12 is made to float on the liquid level (ST2: a step of floating the regulating valve).

Next, the regulating valve 12 closes the space between the vapor pipe 2 and the tank 13 (ST3: a blocking step).

Thereafter, the refrigerant liquid CL is stored on the lower surface of the tank 13, and each time the liquid level of the refrigerant liquid CL rises, the regulating valve 12 floating on the liquid level closes the space between the vapor pipe 2 and the tank 13.

Although the embodiments of the present invention have been described above, the embodiments are shown as an example and are not intended to limit the scope of the invention. The embodiments can be implemented in various other forms, and various omissions, substitutions, and changes can be made without departing from the gist of the invention. This embodiment and its modifications are included in the scope and gist of the invention as well as within the invention described in the claims and the equivalent scope thereof.

What is claimed is:

1. A gas-liquid separation device comprising:
    a tank which is provided in a heat receiving section configured to recover exhaust heat from a cooling object, and has a refrigerant vapor inflow section into which a refrigerant vapor flowing out from the heat receiving section via a vapor pipe is introduced, and a refrigerant gas outflow section from which the refrigerant gas of the refrigerant vapor is discharged, the tank being capable of storing refrigerant liquid of the refrigerant vapor on a lower surface; and a regulating valve which floats on the refrigerant liquid stored in the tank and closes a space between the vapor pipe and the tank.

2. The gas-liquid separation device according to claim 1, wherein the regulating valve has a ring shape.

3. The gas-liquid separation device according to claim 1, wherein the regulating valve is inserted into a protruding section of the vapor pipe which protrudes into the tank.

4. The gas-liquid separation device according to claim 3, wherein the regulating valve has a seal section which seals the refrigerant liquid between the regulating valve and the protruding section.

5. A rear door comprising:
a heat receiving section configured to recover exhaust heat from a cooling object;
a vapor pipe being connected to the heat receiving section; and
a gas-liquid separation device;
wherein the gas-liquid separation device comprises:
  a tank having a refrigerant vapor inflow section into which a refrigerant vapor flowing out from the heat receiving section via the vapor pipe is introduced, and a refrigerant gas outflow section from which the refrigerant gas of the refrigerant vapor is discharged, the tank being capable of storing refrigerant liquid of the refrigerant vapor on a lower surface; and
  a regulating valve which floats on the refrigerant liquid stored in the tank and closes a space between the vapor pipe and the tank.

6. A cooling device comprising:
a heat receiving section configured to recover exhaust heat from a cooling object;
a vapor pipe being connected to the heat receiving section;
a gas-liquid separation device including:
  a tank having a refrigerant vapor inflow section into which a refrigerant vapor flowing out from the heat receiving section via the vapor pipe is introduced, and a refrigerant gas outflow section from which the refrigerant gas of the refrigerant vapor is discharged, the tank being capable of storing refrigerant liquid of the refrigerant vapor on a lower surface; and
  a regulating valve which floats on the refrigerant liquid stored in the tank and closes a space between the vapor pipe and the tank;
a heat exchanger configured to condense the refrigerant gas by heat exchange;
a first pipe configured to connect the gas-liquid separation device and the heat exchanger; and
a second pipe configured to connect the heat exchanger and the gas-liquid separation device.

7. A method for separating a gas from a liquid, the method comprising:
providing a regulating valve capable of floating on a refrigerant liquid inside a tank which is provided in a heat receiving section configured to recover exhaust heat from a cooling object, and has a refrigerant vapor inflow section into which a refrigerant vapor flowing out from the heat receiving section via a vapor pipe is introduced, and a refrigerant gas outflow section from which the refrigerant gas of the refrigerant vapor is discharged, the tank being capable of storing the refrigerant liquid of the refrigerant vapor on a lower surface;
storing the refrigerant liquid on the lower surface in the tank to make the regulating valve float; and
closing a space between the vapor pipe and the tank.

* * * * *